US006953232B2

(12) United States Patent
Busby et al.

(10) Patent No.: US 6,953,232 B2
(45) Date of Patent: Oct. 11, 2005

(54) LATCHING MECHANISM FOR SECURING A COMPUTER COMPONENT INTO A HOUSING

(75) Inventors: Daniel Busby, Sterling, MA (US); Gerhard Pawelka, Lexington, MA (US); Robert J. McCaffrey, Hillsboro, NH (US); José Colucci, Jr., Lexington, MA (US)

(73) Assignee: Egenera, Inc., Marlboro, MA (US)

( * ) Notice: Subject to any disclaimer, the term of this patent is extended or adjusted under 35 U.S.C. 154(b) by 205 days.

(21) Appl. No.: 10/283,792

(22) Filed: Oct. 30, 2002

(65) Prior Publication Data

US 2003/0080568 A1 May 1, 2003

Related U.S. Application Data

(60) Provisional application No. 60/340,916, filed on Oct. 30, 2001.

(51) Int. Cl.[7] .............................................. H05K 5/00
(52) U.S. Cl. ..................... 312/332.1; 361/726; 292/196; 292/97; 439/160
(58) Field of Search ................................ 292/117, 123, 292/223, 196, 97; 312/332.1, 223.1; 361/725, 726, 727, 683; 439/160, 157

(56) References Cited

U.S. PATENT DOCUMENTS

| | | | |
|---|---|---|---|
| 3,198,564 A | * | 8/1965 | Welsh ......................... 292/117 |
| 4,003,614 A | * | 1/1977 | Geer et al. ............... 312/332.1 |
| 4,006,951 A | * | 2/1977 | Geer et al. ............... 312/332.1 |
| 4,679,123 A | | 7/1987 | Young |
| 5,168,431 A | | 12/1992 | Moulton et al. |
| 5,208,735 A | * | 5/1993 | Twachtmann et al. ...... 361/725 |
| 5,546,273 A | | 8/1996 | Harris |
| 5,575,529 A | | 11/1996 | Dowdy et al. |
| 5,638,895 A | | 6/1997 | Dodson |
| 5,653,483 A | * | 8/1997 | Grover ....................... 292/194 |
| 6,027,345 A | | 2/2000 | McHugh et al. |
| 6,147,872 A | * | 11/2000 | Roy ........................... 361/754 |
| 6,202,291 B1 | | 3/2001 | Toedtman |
| 6,231,144 B1 | * | 5/2001 | Chen et al. .............. 312/332.1 |
| 6,243,265 B1 | | 6/2001 | Wong et al. |
| 6,297,962 B1 | | 10/2001 | Johnson et al. |
| 6,325,636 B1 | | 12/2001 | Hipp et al. |
| 6,377,471 B1 | | 4/2002 | Chong et al. |
| 6,406,312 B1 | * | 6/2002 | Heitkamp ................... 439/160 |
| 6,421,215 B1 | | 7/2002 | Bushue |
| 6,493,319 B1 | | 12/2002 | Kramzrczyk et al. |
| 6,599,143 B1 | | 7/2003 | Chong et al. |
| 6,666,697 B2 | * | 12/2003 | Yamashita .................. 439/157 |
| 2003/0081386 A1 | | 5/2003 | Robillard et al. |

* cited by examiner

*Primary Examiner*—Janet M. Wilkens
(74) *Attorney, Agent, or Firm*—Wilmer Cutler Pickering Hale and Dorr LLP

(57) ABSTRACT

A latch mechanism secures a computer component to a chassis; the mechanism includes a base that is attached to the computer component, a latch handle pivotably mounted on the base, the latch handle being capable of pivoting away from the base. An actuator arm is pivotably mounted to the latch handle so that when the latch is pivoted away from the base, the actuator arm will also move away from the base. A cam plate is also pivotably mounted on the base and is capable of rotating with respect to the base. The cam plate includes at least one notch adapted to cooperate with the chassis so that as the cam plate is rotated, the notch selectively engages and disengages with the chassis.

16 Claims, 7 Drawing Sheets

LATCHING MECHANISM FOR SECURING A COMPUTER COMPONENT INTO A HOUSING

BACKGROUND OF THE INVENTION

The present invention relates to a latch; more specifically the present invention relates to a latch that can be used to secure a computer component into a chassis.

Latches have been used extensively for securing, or latching, one thing to another. In every context people are confronted with different latches which are designed to solve particular problems in a variety of situations. For example, latches that open and close a car door have certain latching characteristics which are necessary for the application. The latch must be secure and reliable, it must be able to close and latch using a varied applied force, etc.

Other latches may be designed for decorative purposes and provide the user with an aesthetically pleasing latch. It is often important that a latch which is used frequently include features which provide an ergonomically comfortable opening and closing mechanism. Typically, the ergonomically designed latch should be easy and comfortable to use.

In the computer industry there has been an increasing usage of computer chassis systems to which multiple computer housings may be inserted.

SUMMARY OF THE INVENTION

The present invention provides a latch mechanism which is adapted to secure a computer component to a chassis; the mechanism includes a base that is attached to the computer component, a latch handle pivotably mounted on the base; and the latch handle is capable of pivoting away from the base. An actuator arm is pivotably mounted to the latch handle so that when the latch is pivoted away from the base into an unlatched position, the actuator arm will also move away with respect to the base. A cam plate is also pivotably mounted on the base and is capable of rotating with respect to the base. The cam plate includes at least one notch adapted to cooperate with the chassis so that as the cam plate is rotated, the notch selectively engages and disengages with the chassis to secure the computer housing to the base.

The latch of the present invention may further include a locking plate that is adapted to seat against the cam plate when the cam plate is in a secured position and prevent the cam plate from moving. The locking plate may also include a surface which cooperates with the actuator arm to unlock the cam plate and permit the cam plate to rotate. The latch mechanism may also include a spring that is mounted on the locking arm at one end and the base at the other, wherein the spring biases the locking arm toward the cam plate. The actuator arm may include a pin that forces the locking arm to move when the latch handle is pulled.

The cam plate may include two notches and the chassis has two securement pins which are adapted to fit within the cam plate notches to secure the computer housing to the chassis. The cam plate may include a slot which cooperates with a pin at the distal end of the actuator arm so that when the latch handle is pulled, the pin causes the cam plate to move in the counter clockwise direction.

In another embodiment, the present invention relates to a latch mechanism for attaching a housing to a chassis featuring a latch handle pivotably mounted to a base, an actuator arm pivotably mounted to the latch at one end, a cam plate pivotably mounted on the base and adapted to selectively latch and unlatch the mechanism, the cam plate including at least one notch to secure the cam plate to the chassis, wherein the other end of the actuator arm cooperates with the cam plate to selectively lock and unlock the latch mechanism.

The cam plate may further comprise a slot and the distal end of the actuator arm may comprise a pin, wherein the pin cooperates with the slot to move the cam plate. The latch mechanism may include a locking arm that is pivotably mounted to the base, wherein the locking arm cooperates with the cam plate to lock the cam plate against rotation when the latch is in the second position. The locking arm may include a surface against which the actuator arm can move so that when the latch handle is pulled, the actuator arm moves the locking arm so that the cam plate can rotate. The actuator may further include a pin which moves against the actuator surface which moves the locking arm and the locking arm may be biased toward engagement with the cam plate by a spring.

The cam plate of the latch mechanism may be biased for counter clockwise rotation by a spring. The spring which biases the cam plate may be a rotational spring that is mounted on at the pivot point of the cam plate.

Accordingly, the present invention provides a latch which automatically latches as the housing is inserted so that all the user need do is push the housing into the chassis to secure the housing in the chassis. The automatic latching feature can provide some significant advantages to a computer processing chassis system. First, an operator need only push the processor into the chassis and does not have to coordinate a latching operation. Moreover, the automatic latch feature provides a quicker, more efficient operation. The processor slides into the locking position by rails which guide and align the processor.

The invention also provides a latch which can unlock with minimal force required to pull the latch to unlock the computer housing from the chassis.

DETAILED DESCRIPTION

Figure 1:
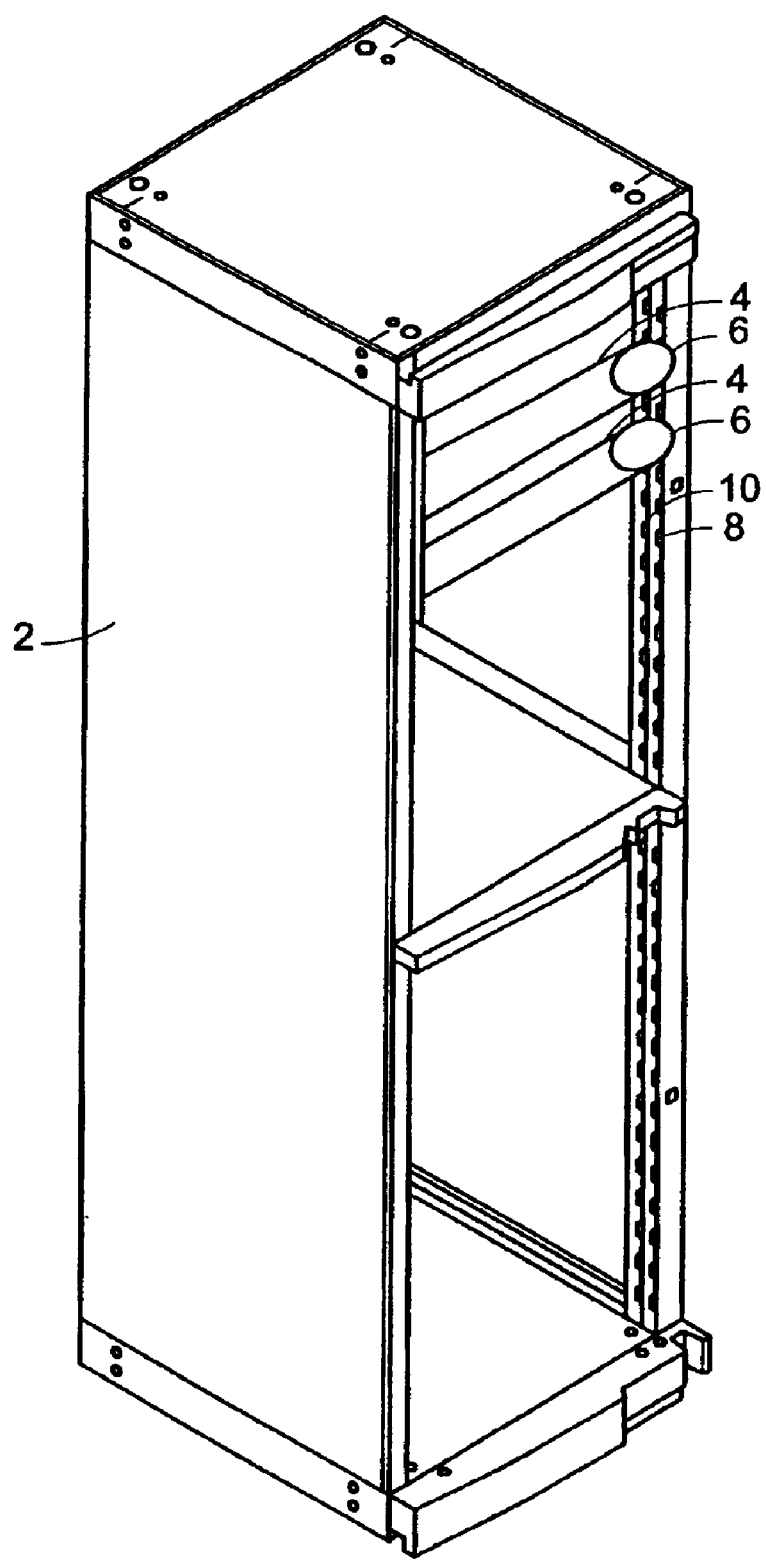
FIG. 1 is a view of a chassis with computer housings attached.

FIG. 1 shows a chassis 2 which houses multiple computer components or housings 4. The chassis is about 84 inches tall, 24 inches wide and 30 inches deep. The chassis is adapted to contain multiple computer housings which are generally rectangular boxes about 20 inches wide, 2–8 inches high and 20 inches deep. The computer housings contain processors (not shown) and switches (also not shown) sufficient for the operation of the system. Each housing is connected to the chassis via a data and power connection (not shown) which is described in detail in co-pending application Ser. No. 10/283,702, entitled "Simplified Power and Data Connector for Use with Chassis Systems that House Multiple Processors") which is incorporated by reference.

Figure 2A:
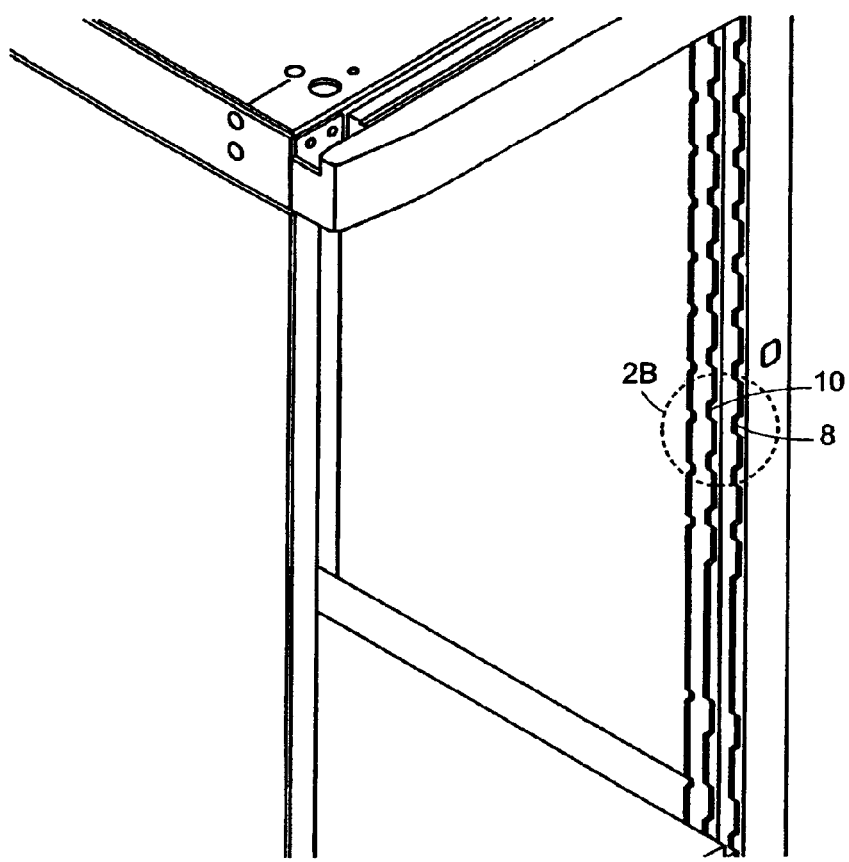
FIG. 2A is a partial view of the chassis with detail about the actuator tabs.

The latch 6 allows the computer housing to be secured within a corresponding slot in the chassis once the computer housing is inserted into the chassis. FIG. 2A shows a detailed view of the latch as it secures the computer housing to the chassis (shown in phantom). As illustrated, a cam plate (described in detail below) in the latch 6 interacts with two latch posts 8, 10 and causes the latch to close and become secured. As the cam plate is rotated it drives the component in or out of the chassis. The operation of the latch posts and the latch will become apparent as the components of the latch are described.

Figure 3:
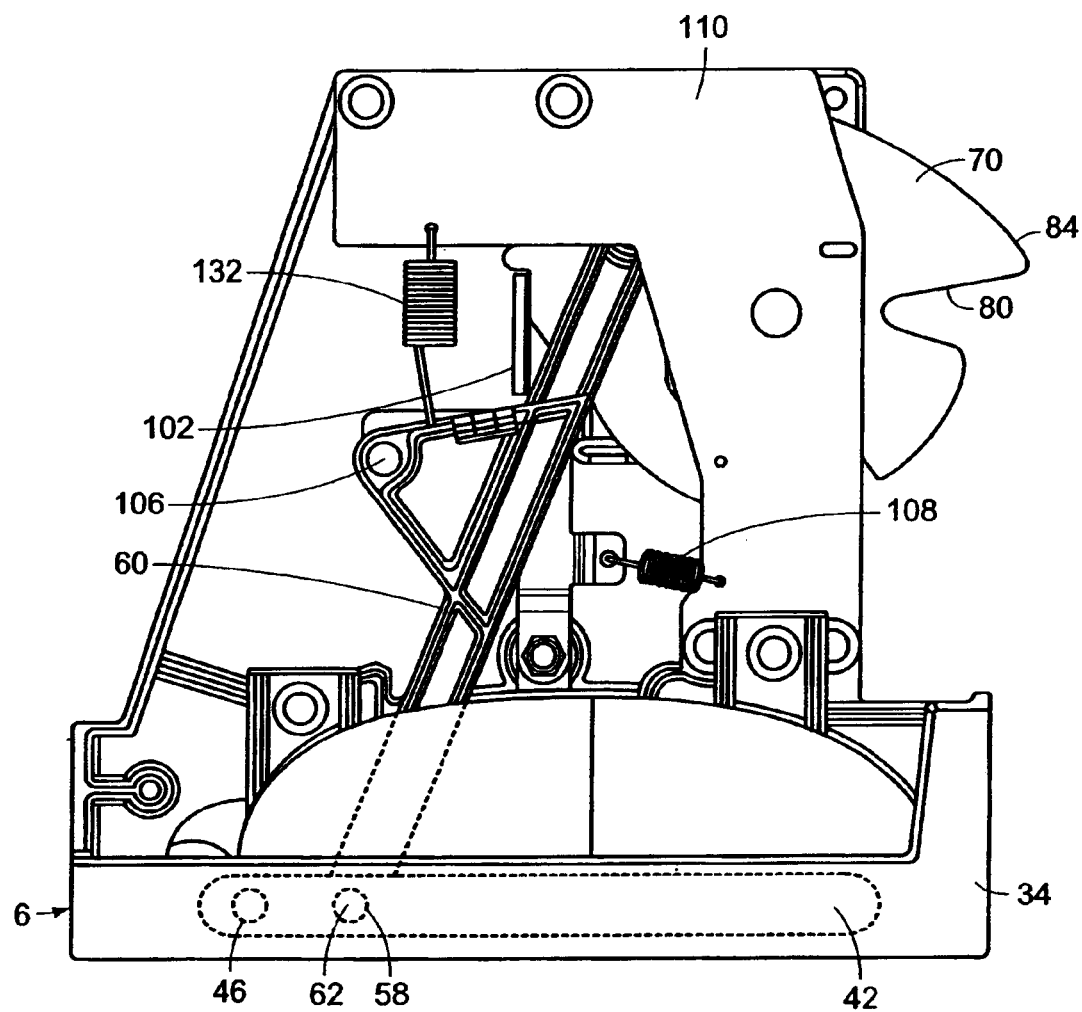
FIG. 3 is a top view of the latch of the present invention.
Figure 4:
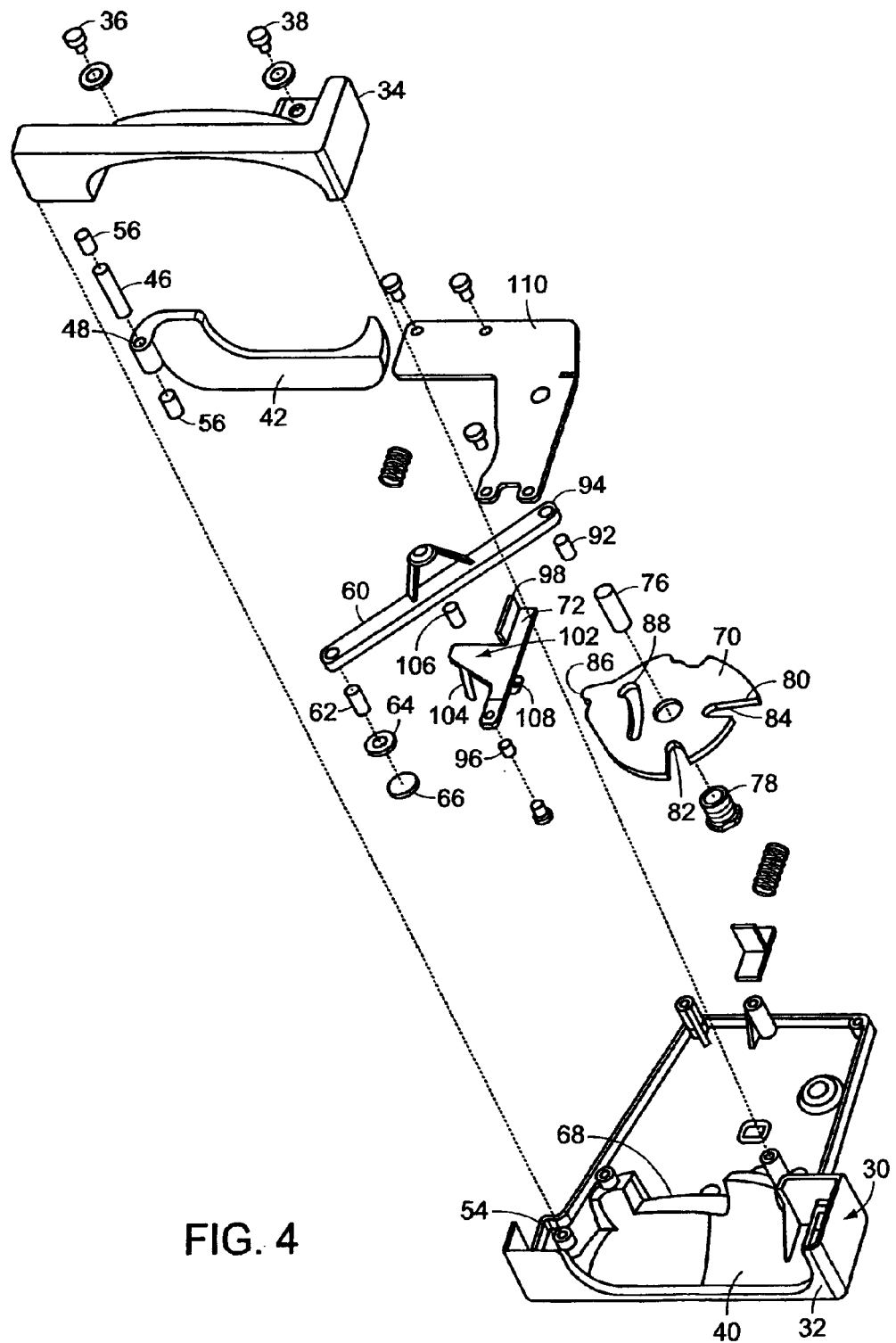
FIG. 4 is an exploded view showing the various components of the latch.

FIGS. 3 and 4 are a top view of the latch and an expanded view of the latch components, respectively. The latch components are supported by a generally rectangular base 30. The latch includes a face portion 32 which is positioned at the right side of the outwardly facing side of the computer housing or chassis 2. The front part of the base 30 is adapted to mate with a cover 34 by screws 36 and 38. The base 30 and the cover 34 cooperate to form a recess 40 which is adapted to fit a latch handle 42. As shown in FIG. 3, when the latch handle 42 is in its secured position, it is positioned entirely within the recess 40. The latch handle is pivotably mounted to the base 30 and cover 34 by a pin 46 which is secured into an aperture 48. The pin is positioned in an aperture 54 in the bottom of the cover and another aperture (not shown) in the top cover 34. The pin is able to pivot within the apertures. Sleeves 56 may be provided to provide a tight tolerance between the pin 46 and the apertures.

The recess 40 and the latch handle 42 are ergonomically designed and allow several fingers to be inserted into the recess and pull on the latch handle so that the latch handle pivots on the pin to a position about 45°. The inner surface (not shown) of the latch handle has a smooth curved finish to enhance the comfort of the user pulling the latch handle to unlatch the computer housing from the chassis.

The latch handle 42 includes an aperture 58, shown in phantom in FIG. 3, which is located off-set from the latch handle approximately 0.5 inches (1.25 cm). An actuator 60 is pivotably mounted to the latch by an actuator pin 62. The actuator pin is secured in place by a washer 64 and a clip 66. The actuator arm is pivotable about the pin in a range that allows the latch arm to swing out. The actuator arm extends through a recess 68 in the base toward the other components of the latch. The recess 68 is sufficiently sized to allow for swing movement of the actuator when the latch handle is pulled.

The latching components are described below. In addition to the actuator arm 60, a cam plate 70 cooperates with a locking arm 72 to secure the latch in a locked position. When in the locking position, the locking arm 72 prevents the cam plate 70 from rotating and secures the latch in place. When the locking arm is moved away, the actuator arm is free to move the cam plate so that the latch is unsecured.

In more detail, and with continued reference to FIG. 4, the cam plate 70 is positioned on the right rear-ward location of the base and mounted in such a manner that the cam plate can rotate about a mounting pin 76. The plate 70 is biased by a coil spring 78 which urges the plate toward the counter clockwise direction.

Figure 2B:
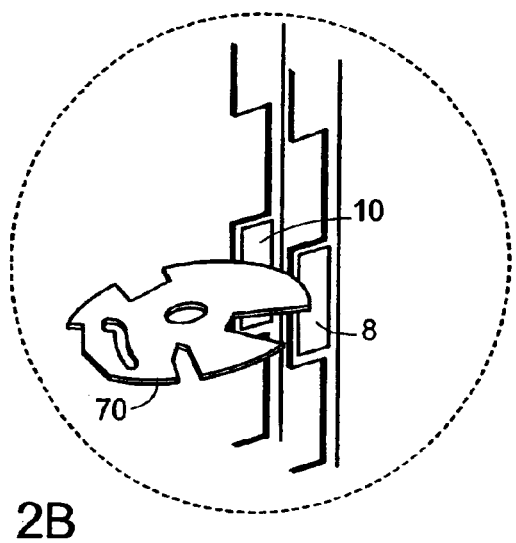
FIG. 2B is a detail view of the actuator tabs and a cam plate within the latch.

The cam plate has several contours in its perimeter profile that are intended to perform various functions. Along the portion of the cam plate that is along the outboard side of the base, are two inward notches 80 and 82 which cooperate with securement arms shown as pins 8 and 10 (shown in FIG. 2) on the chassis. A radially extending projection 84 secures the cam plate against the latch posts so the computer housing does not move from the chassis. A notch 86 forms a recess on the inboard side of the cam plate 70 into which the locking arm 72 can fit when the cam plate is locked in place.

The cam plate 70 also has an arcuate slot 88 formed in the plate on the side of locking notch 86. The arcuate slot is adapted to receive a pin 92 which is fixed to the distal end 94 of the actuator 60. The pin 92 is sized to slide within the groove in response to the motion of the cam plate and the actuator arm.

The locking arm 72 of the latch mechanism is pivotably mounted on the base 30 by a screw 96. The locking arm is able to pivot a sufficient range of motion so that the distal end 98 of the locking arm can engage with the cam plate 70 at the locking notch 86. A portion of the distal end 98 of the locking arm 72 is bent 90° to create an interengagement location. This can be considered a "stop mechanism" since the locking arm engages (stops) the cam plate. In the preferred form, the angled portion extends upward about 0.4 inches.

Intermediate the pivot attachment point 96 and the distal end 98 is an unlock actuator surface 102 which extends about 1 inch off a centerline created between the pivot pin 62 and the distal end which contains pin 92. The surface 102 extends 90° from the locking arm and is bent away from the locking arm at bend 104 to form bend angle α. The preferred bend angle a is about 150°. The actuator arm 60 includes a pin 106 which is offset from the centerline which extends to and cooperates with the locking arm to unlock activation surface 102. The locking arm has one side of a tension spring 108 attached, the other side of the spring is attached to the base. The spring biases the locking arm toward the cam plate. A retention plate 110 is attached to the base and secures the components in place.

Figure 5:
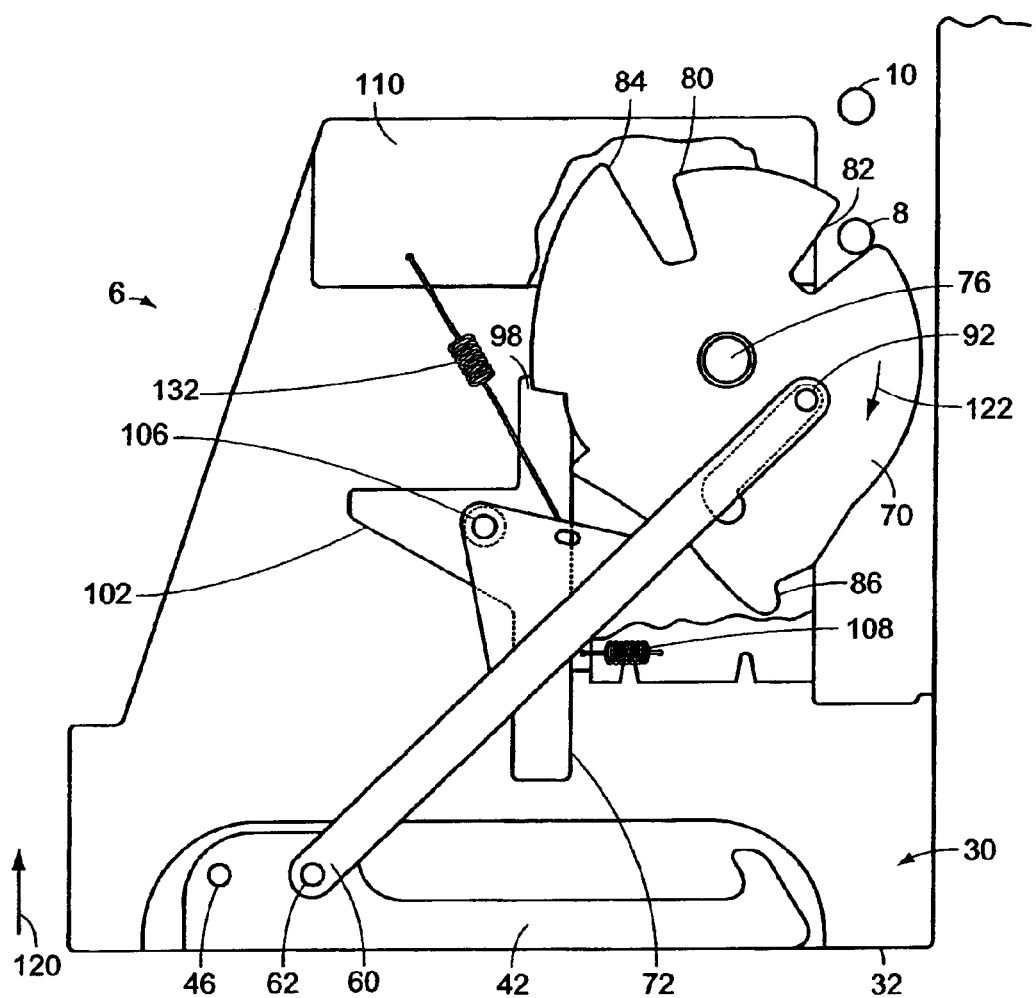
FIG. 5 shows a partial cut away view of the latch partially inserted into the housing.
Figure 6:
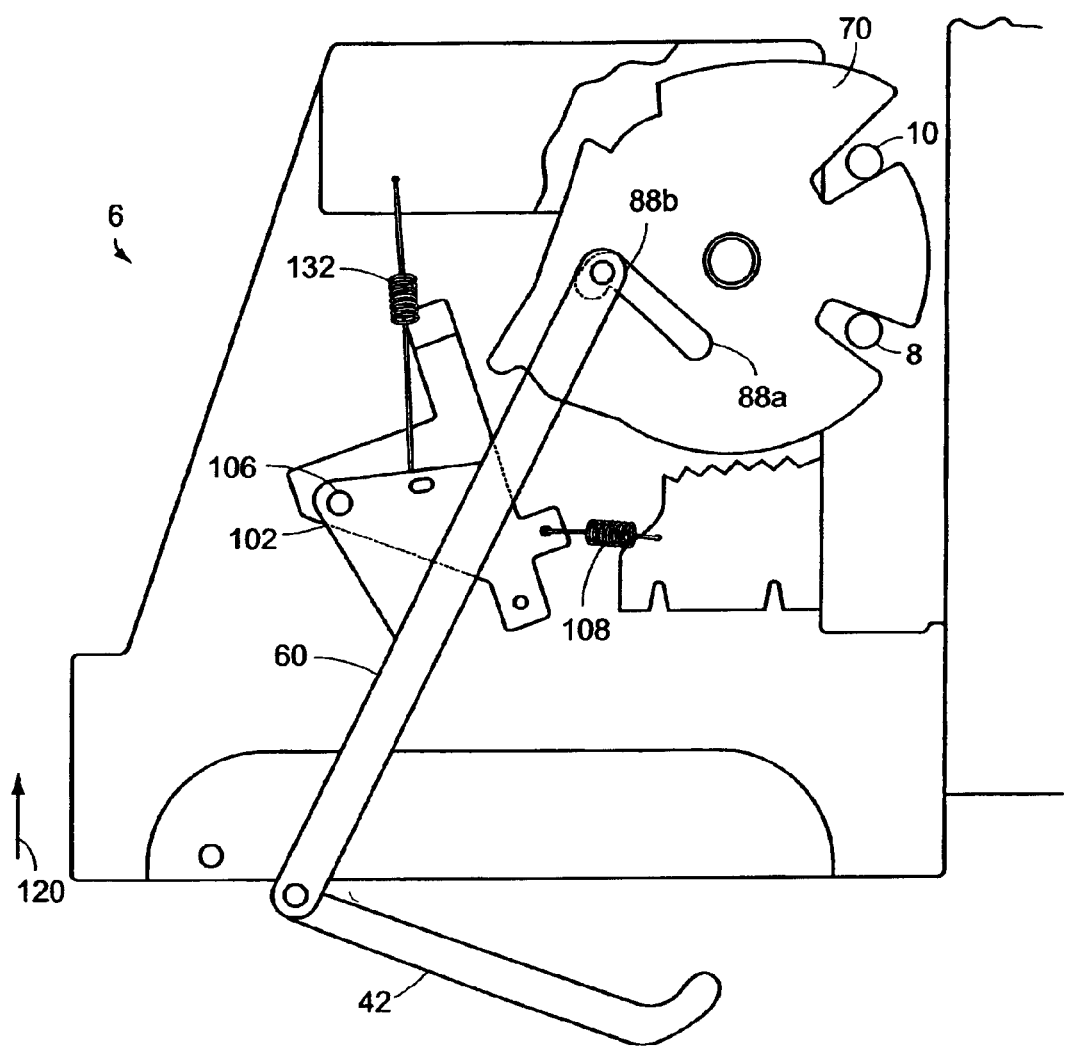
FIG. 6 shows a partial cut away view of the latch partially inserted into the housing.
Figure 7:
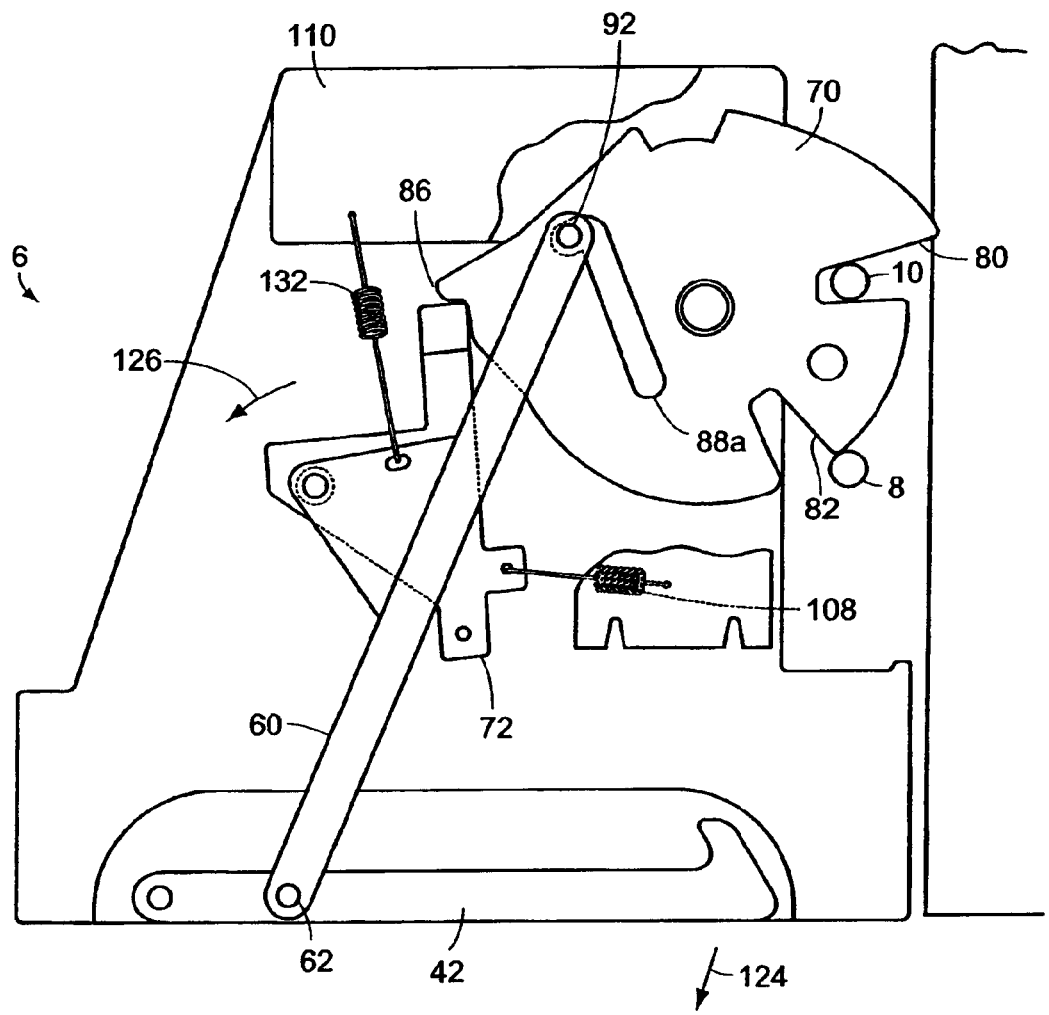
FIG. 7 shows a partial cut away view of the latch partially inserted into the housing.

The locking sequence of the latch is described with reference to FIGS. 5–7. FIG. 5 shows the lock as it is being inserted into the chassis as shown by arrow 120. The notch 82 contacts the chassis-locking pin 8. The pin 8 forces the cam plate 70 to rotate clockwise as shown by arrow 122 about the cam plate pin 76. As the cam plate rotates, the activation pin 92 which slides within slot 88 as shown in FIGS. 5–7a is forced to the end of the slot designated 88a and, as the cam plate continues to rotate, the activation arm 60 is forced forward which causes the latch handle to pivot outward away from the base, as shown in FIG. 6. A tension spring 132 biases the actuator arm 60 toward the back of the base so that the cam plate rotates sufficiently to complete the movement of the pin 92 to the other end of slot 88 designated 88b.

FIG. 6 also shows the cam plate notch 80 engaging with pin 10. The cooperation of the two pins permits the closing of the latch reliably with a minimal amount of space. The latch is secured in place by the locking arm 72 which is biased by a spring 108 to pivot toward the cam plate. As shown in FIG. 7, the distal end 98 of the locking arm 72 engages the notch 86 so that the latch is secured.

The latch will stay secured until someone pulls on the latching arm. As someone pulls on the locking arm represented in FIG. 7 by arrow 124, the actuator arm is pulled forward because of pin 62. The movement of the actuator arm causes the pin 106 to slide against the locking plate 102 on the locking arm 72. The contact between the plate 102 and the pin 106 causes the actuator arm 72 to pivot in a counter-clockwise direction as shown by arrow 126 so that the locking arm 72 moves away from the notch 86 in the cam plate 70. The spring 78 causes the cam plate to rotate counter-clockwise and release the latch and allow the computer housing to be removed from the chassis.

In connection with the automatic locking feature, the handle will project outward slightly during the engagement so that the person inserting the housing into the chassis is aware when the latch is about to lock on the housing. Once the latch is locked and the housing is secured in the chassis then the handle will be flush with the housing as shown.

While this invention has been described with reference to particular embodiments, other and different devices, including those obvious to those skilled in the art, will embody the invention and are within the scope of the following claims.

What is claimed is:

1. A latch mechanism to secure a computer component to a chassis, the mechanism comprising:
    a base attachable to the computer component, a latch handle pivotably mounted on the base, the latch handle being capable of pivoting away from the base;
    an actuator arm pivotably mounted to the latch handle so that the actuator arm moves when the latch handle is pivoted away from the base; and,
    a cam plate pivotably mounted on the base and capable of rotating with respect to the base and having at least one notch, the at least one notch adapted to cooperate with the chassis so that as the cam plate is rotated, the notch selectively engages and disengages with the chassis; wherein the actuator arm is adapted to move the cam plate in response to the latch handle being pivoted away from the base, wherein the latch mechanism operates to secure the computer component automatically when the component is positioned in the chassis and a locking arm, wherein the locking arm is adapted to seat against the cam plate when the cam plate is in a secured position and prevent the cam plate from moving.

2. The latch mechanism of claim 1, wherein the locking arm includes a surface which cooperates with the actuator arm to unlock the cam plate when the latch handle is pivoted to permit the cam plate to rotate.

3. The latch mechanism of claim 2, further comprising a spring having first and second ends, the first end of the spring mounted on the locking arm and the second end of the spring mounted on the base, wherein the spring biases the locking arm toward the cam plate.

4. The latch mechanism of claim 2, wherein the actuator arm includes a pin that forces the locking arm to move when the latch handle is pulled.

5. The latch mechanism of claim 1, wherein the cain plate includes two notches which are adapted to engage two securement pins on the chassis, the pins are adapted to fit within the cam plate notches to secure the computer housing to the chassis.

6. The latch mechanism of claim 1, wherein the cam plate includes a slot, and the actuator arm includes a distal end and a pin is attached to the distal end of the actuator arm so that when the latch handle is pulled the pin causes the cam plate to move in the counter clockwise direction.

7. The latch mechanism of claim 1, wherein the locking arm includes a stop mechanism that stops the rotation of the cam plate when the locking arm is engaged with the cam plate.

8. A latch mechanism for attaching a housing to a chassis comprising a latch handle pivotably mounted to a base, an actuator arm pivotably mounted to the latch handle at one end, a cam plate pivotably mounted on the base and adapted to selectively latch and unlatch the mechanism, the cam plate including at least one notch to secure the cam plate to the chassis, wherein the other end of the actuator arm cooperates with the cam elate to selectively lock and unlock the latch mechanism wherein the cam plate further comprises a slot and the distal end of the actuator arm comprises a pin, wherein the pin cooperates with the slot to move the cam plate, further comprising a locking plate pivotably mounted to the base, wherein the locking plate cooperates with the cam plate to lock the cam plate against rotation when the latch handle is in a retracted position.

9. The latch mechanism of claim 8, wherein the locking plate includes a surface against which the actuator arm can activate so that when the latch handle is pulled, the actuator arm moves the locking plate so that the cam plate can rotate.

10. The latch mechanism of claim 9, wherein the actuator arm includes a pin which moves against the surface which moves the locking plate.

11. The latch mechanism of claim 10, wherein the locking plate is biased toward engagement with the cam plate by a spring.

12. The latch mechanism of claim 11, wherein the cam plate is biased for counter clockwise rotation by a spring.

13. The latch mechanism of claim 12, wherein the cam plate spring which biases the cam plate is a rotational spring which is mounted on at the pivot point of the cam plate.

14. A latch mechanism for attaching a housing to a chassis comprising a latch handle pivotably mounted to a base, an actuator arm pivotably mounted to the latch handle at one end, a cam plate pivotably mounted on the base and adapted to selectively latch and unlatch the mechanism, the cam plate including at least one notch to secure the cam plate to the chassis, wherein the other end of the actuator arm cooperates with the cam plate to selectively lock and unlock the latch mechanism, wherein the mechanism automatically latches the mechanism when the housing is inserted into the chassis, wherein the cam plate further comprises a slot and the distal end of the actuator arm comprises a pin, wherein the pin cooperates with the slot to move the cam plate, and further comprising a locking plate pivotably mounted to the base, wherein the locking plate cooperates with the cam plate to lock the cam plate against rotation when the latch handle is in retracted position.

15. The latch mechanism of claim 14, wherein the locking plate includes a stop mechanism that stops the rotation of the cam plate when the locking plate is engaged with the cam plate.

16. A chassis housing system including a latch mechanism which is adapted to secure a computer component to a chassis, the mechanism comprising:
    a base attachable to the computer component, a latch handle pivotably mounted on the base, the latch handle being capable of pivoting away from the base; an actuator arm pivotably mounted to the latch handle so that the actuator arm moves when the latch handle is pivoted away from the base; and,
    a cam plate pivotably mounted on the base and capable of rotating with respect to the base and having at least one notch, the at least one notch adapted to cooperate with the chassis so that as the cam plate is rotated, the notch selectively engages and disengages with the chassis; wherein the actuator arm is adapted to move the cam plate in response to the latch handle being pivoted away from the base, wherein the latch mechanism operates to latch the computer component automatically when the component is positioned in the chassis, wherein the cam plate further comprises a slot and the distal end of the actuator arm comprises a pin, wherein the pin cooperates with the slot to move the cam plate and further comprising a locking plate pivotably mounted to the base, wherein the locking plate cooperates with the cam plate to lock the cam plate against rotation when the latch handle is in a retracted position.

* * * * *